United States Patent
Kurshan et al.

(10) Patent No.: US 6,295,515 B1
(45) Date of Patent: *Sep. 25, 2001

(54) STATIC PARTIAL ORDER REDUCTION

(75) Inventors: Robert Paul Kurshan, New York, NY (US); Vladimir Levin, New Providence, NJ (US); Marius Minea, Pittsburgh, PA (US); Doron A. Peled, Springfield, NJ (US); Husnu Yenigun, Kucukesat Ankara (TR)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/172,460

(22) Filed: Oct. 14, 1998

Related U.S. Application Data
(60) Provisional application No. 60/064,080, filed on Nov. 3, 1997.

(51) Int. Cl.[7] .............................. G06F 7/60; G06F 17/10; G06F 17/50; G06G 7/62
(52) U.S. Cl. .................................. 703/13; 703/2
(58) Field of Search ............................. 703/2, 13

(56) References Cited

U.S. PATENT DOCUMENTS

| | | | |
|---|---|---|---|
| 5,163,016 | * 11/1992 | Har'El et al. | 716/5 |
| 5,615,137 | * 3/1997 | Holzmann et al. | 703/17 |
| 5,740,084 | * 4/1998 | Hardin et al. | 703/2 |
| 5,901,073 | * 5/1999 | Kurshan et al. | 703/6 |

OTHER PUBLICATIONS

Gerth et al.; "A partial order approach to branching time logic model checking", IEEE Proc. Theory of Comp. & Systems; pp. 130–139, Jan. 1995.*

(List continued on next page.)

Primary Examiner—Kevin J. Teska
Assistant Examiner—Hugh Jones
(74) Attorney, Agent, or Firm—Henry T. Brendzel

(57) ABSTRACT

A static partial order reduction generator and process result in a substantially reduced state space graph of a multi-process system, independently of the model checking process. The process of this invention creates a modified state graph generator with appended rules that allow any desired state searching tactic (breadth first, depth first, etc.) to be employed when states and transitions are considered in the course of verification. This permits use of existing model checking tools without needing to modify them. The static partial order reduction is made possible by realizing that a prior art condition that at least one state along each cycle of the reduced state graph must be fully expanded can be guaranteed by considering the individual processes that make up the system and identifying certain transitions in those processes.

15 Claims, 1 Drawing Sheet

OTHER PUBLICATIONS

Saha et al.: A fast protocol conversion technique using reduction of state transition graphs; IEEE Conf. Comp. and Comm.; pp. 628–635, 1992.*

Clarke et al.; Computer aided verification; IEEE Spectrum; pp. 61–67, 1996.*

Macii et al.; Formal verification of digital systems by automatic reduction of data paths; IEEE Trans. CAD of IC; pp. 1136–1156, 1997.*

Peled, D, "Partial Order Reduction: Model Checking Using Representatives", Mathematical Foundations of Computer Science 1996, 21st Int'l. Symposium, MFCS '96, Proceedings, Mathematical Foundations of Computer Science 1996, Cracow, Poland, Sep. 2–6, 1996.

Godefroid, P., et al., "Using Partial–Order Methods in the Formal Validation of Industrial Concurrent Programs", IEEE Trans. on Software Engineering, vol. 22, No. 7, Jul. 1996.

Alur, R., et al. "Partial–Order Reduction in Symbolic State Space Exploration", Computer Aided Verification., 9th Int'l Conf., CAV'97. Proceedings, Computer Aided Verification, 9th Int'l Conf., CAV'97. Proceedings, Haifa, Israel, Jun. 22–25, 1997.

* cited by examiner

STATIC PARTIAL ORDER REDUCTION

REFERENCE TO RELATED APPLICATIONS

This application claims the benefit of U.S. Provisional Application No. 60/064,080, filed Nov. 3, 1997. This application is also related to a second application, titled "Verifying Hardware in its Software Context And Vice-Versa," filed by the inventors herein on even date herewith.

BACKGROUND

This invention relates to system specification reduction methods.

One common method for dealing with the intrinsically intractable computational complexity of model-checking asynchronous systems is partial order reduction. This reduction technique exploits the common practice of modeling concurrent events in asynchronous systems as an interleaving of the events in all possible execution orders. An important observation about such systems is that often the properties one needs to check do not distinguish among these different orders. The reduction algorithm produces a state graph which contains only a subset of the states and transitions of the original system, but which contains enough information about the modeled system so that it is possible to apply model-checking algorithms to it instead of the full state graph. The verified property is guaranteed to be true in the reduced model if and only if it is true in the original model.

Since partial order reduction is naturally defined for asynchronous systems, it has thus far been applied mainly to the verification of software. Traditional partial order reduction algorithms use an explicit state representation, and a depth-first search. In contrast, other techniques for model checking, most notably symbolic model checking based on binary decision diagrams (BDDs), have proved most effective for synchronous systems, in particular for verifying hardware.

Previous implementations of partial order reduction algorithms in pre-existing state space search engines required considerable changes in the search mechanism. See, for example, P. Godefroid and D. Pirottin, "Refining Dependencies Improves Partial Order Verification Methods," *Proc. 5th Conference on Computer Aided Verification, vol.* 697 *of Lecture Notes in Computer Science,* pp. 438–449, Elounda, June 1993, Springer-Verlag, and G. J. Holzmann and D. Peled "An Improvement in Formal Verification," *Formal Description Techniques* 1994, pp. 197–211, Bern Switzerland, 1994, Chapman & Hall. The alternative was to construct a special tool for performing the search, for example, as described by A. Valmari in "A Stubborn Attack on State Explosion," *Proc. 2nd Workshop on Computer Aided Verification, vol.* 531 *of Lecture notes in Computer Science,* pp. 156–165, Rutgers, June, 1009, Springer-Verlag. [14]. In the Holtzman and Peled article, a reduction that is based on doing a large part of the calculations at compile time is described. However, some changes are still made to the search engine, controlling the backtracking mechanism in the depth-first search performed in the SPIN model checker, which is described by G. J. Holzmann in *Design and Validation of Computer Protocols,* Prentice Hall, 1992.

D. Peled described a simplified "ample sets" search method in "Combining Partial Order Reductions With on-the-fly Model Checking," *Formal Methods In System Design,* 8:39–64, 1996. This approach basically contemplates translating the specification into an internal code and then verifying the code with a model-checking tool that includes partial order reduction. The ample sets are the sets of transitions of the reduced graph that still describes the system. Since the notions of "ample sets" are employed in the instant disclosure, this article is hereby incorporated by reference. Closely related to this article is U.S. Pat. No. 5,615,137, issued to Holzmann and Peled on Mar. 25, 1997, and it, too, is hereby incorporated by reference.

In this prior art approach, a generator for the reduced model is created by appending a set of rules to the generator of the original model which, at least in part, are applied in the course of the model checking.

It is an object of this invention to create a set of rules that are applied as a transformation of the original model, and completely independently of the model checking or verification.

It is another object of this invention to create a generator that statically produces a reduced state graph.

It is another object of this invention to create a process that efficiently verifies the design of systems that include both software and hardware, and is well adapted to symbolic model checking.

It is still another object of this invention to create a process that is independent of the type of search employed, and is applicable to a depth-first search approach or a breadth-first search approach without a change.

It is yet another object of this invention to create a process that is compatible with existing model checking tools without requiring a change to their search engines.

SUMMARY

These and other objects are achieved with a process that implements a static partial order reduction. Specifically, the process of this invention creates a modified state graph generator of a multi-process system that is checked by appending to the generator a number of rules that serve to substantially reduce the generated state graph. Moreover, the appended rules condition the generator to realize a substantially reduced state graph in a manner that allows any desired state searching tactic (breadth first, depth first, etc.) to be employed when states and transitions are considered in the course of verification. This permits use of existing model checking tools without needing to modify them. The static partial order reduction is made possible by realizing that a prior art condition that at least one state along each cycle of the reduced state graph must be fully expanded can be guaranteed by considering the individual processes that make up the system and identifying certain transitions in those processes.

DETAILED DESCRIPTION

Figure 1:
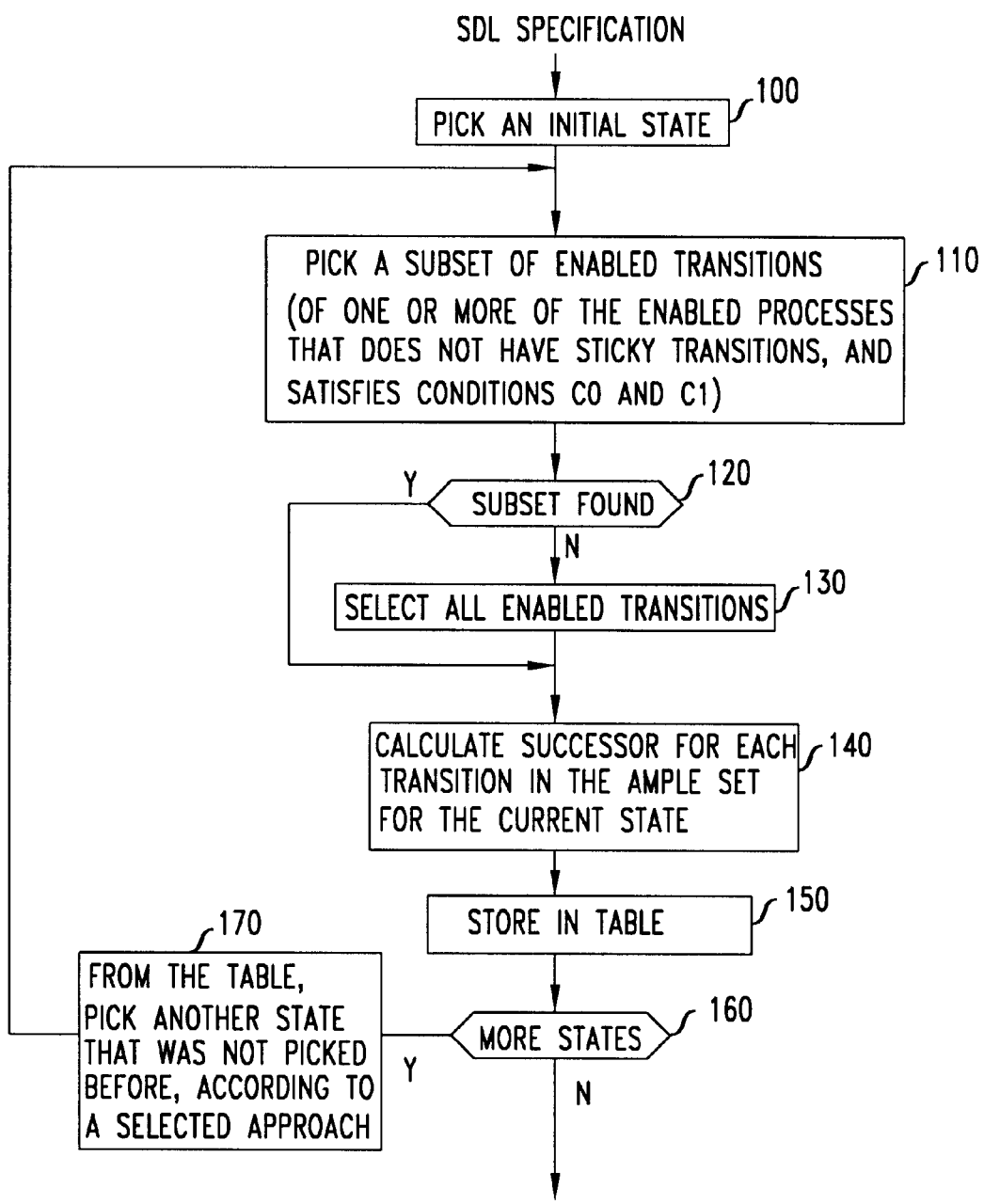
FIG. 1 presents a flow chart of the state reduction algorithm disclosed herein.

The reduction method disclosed herein is applied to systems which, typically, are represented is some language (software-centric for software, and hardware-centric for hardware). A language representation is the implicit representation of a system. A system can also be modeled as a state-transition graph, which is the explicit representation of the system, and this representation can be derived from the implicit representations of the system. In effect, the explicit representation forms a set of rules and constraints for the transitions taken by the system. The implicit representation, then, is a generator for the state-space graph of the system.

The following discloses a set of rules that augment the generator of a system to form a new generator that is capable of forming a reduced state graph of the system. The new generator is independent of the model checking process and of the manner in which a system's states and transitions are traversed (e.g., breadth first, or depth first).

A state transition graph is defined as a tuple $M=(S,S_0,T,L)$, where S is the set of states, $S_0$ is the initial set, T is a set of transitions $\alpha$, and $L:S \rightarrow 2^{AP}$ is a function that labels each state with some subset of a set AP of atomic propositions.

A transition $\alpha$ is enabled in state s if there is some state s' for which $\alpha(s, s')$ holds; i.e., that there is a $\alpha$ transition a which moves the system from state s to state s'. We denote the set of transitions enabled in s by enabled(s). If for any state s there is at most one state s' with $\alpha(s, s')$, we say that $\alpha$ is deterministic, and that $s'=\alpha(s)$.

The following considers only deterministic transitions, but it should be noted that although the transitions are deterministic, which is a usual practice in modeling concurrency, non-deterministic choice between different transitions that are enabled at the same time can be easily modeled.

Independent transitions are transitions with effects that are the same regardless of their relative order. By definition, two transitions $\alpha$ and $\beta$ are independent if for every state s the following two conditions hold:

Enabledness: If $\alpha, \beta \in enabled(s)$ then $\beta \in enabled(\alpha(s))$ and $\alpha \in enabled(\beta(s))$ Commutativity: If $\alpha, \beta \in enabled(s)$ then $\alpha(\beta(s))=\beta(\alpha(s))$, where $\alpha(s)$ is the state reached by taking transition $\alpha$ from state s. In other words, a pair of transitions is independent if, when the system is at a state where both $\alpha$ and $\beta$ are enabled, executing either of them does not disable the other, and executing both in either order leads to the same state. Two transitions are called dependent if they are not independent.

To construct the reachable state space, model checking algorithms perform a traversal of the state-transition graph in accordance with some selected approach (typically, depth-first or breadth-first search). The traversal starts from the set of initial states and successively constructs new states by exploring the transitions that are enabled in the current state.

Partial order reduction differs from full state exploration in that at each step it considers only a subset of the transitions enabled at the current state s. This set is denoted by ample(s) and sometimes referred to as "the ample set". With a good choice of the ample set, only a small fraction of the reachable state space will be explored. However, a number of conditions must be enforced on the ample sets to ensure that the truth-value of the checked property is preserved in the reduced model. The following presents a set of such conditions, together with an informal explanation of their role. A complete treatment of these conditions, together with formal proofs, is provided in the aforementioned, incorporated, D. Peled article.

C0: The selected ample(s) is such that ample(s)=0 if and only if enabled(s)=0.

Condition C0 is the simplest and guarantees that if a state has a successor in the original model, it also has a successor in the reduced model.

C1: The selected ample(s) is such that on any path starting from state s and traversing successor states, all the transitions appearing before a transition that is also found in ample(s), are independent of all of the transitions in ample (s).

To understand C1, it may be noted that not every transition sequence in the original model may appear in the reduced model, because the latter is restricted to transitions from ample(s) at each state s. Meeting condition C1 ensures that no transition which may be taken from ample(s) disables any of the transitions in the original sequence. To demonstrate condition C1, consider some transition sequence $\sigma$ starting a state $s_0$. There are two possible situations for paths emanating from state $s_0$: one where $\sigma$ contains a transition $\alpha$ which is also a transition that is enabled in $s_0$, while the other has no such transition. In the first case, $\sigma$ is of the form $\beta_0 \beta_1 \ldots \beta_n \alpha$, and condition C1 insures that $\alpha$ is independent of any transition $\beta_i$, $i \leq n$ and commutes with every one of these transitions. Consequently, transition $\alpha$ can be taken in state $s_0$ without disabling the sequence $\beta_0 \beta_1 \ldots \beta_n$. In the second case, any transition $\alpha \in enabled(s_0)$ can be taken in $s_0$, it is independent of all transitions in $\sigma$ and therefore $\sigma$ is still enabled in $\alpha(s_0)$ in the original model.

As stated in above, this C1 condition is described by Peled in the aforementioned incorporated article, and in U.S. Pat. No. 5,615,137. Still, some amplification herein may be beneficial, and to that end, some heuristics are presented below for identifying ample sets that meet Condition C1.

The algorithm for identifying ample sets can depend on the model of computation. The following considers shared variables and message passing with handshaking and with queues.

Common to all of these models of computation is the notion of a program counter, pc(s), which is part of the state. The program counter of a process $P_i$ in a state s is denoted by $pc_i(s)$. The following notation is used in presenting the algorithm for determining ample sets:

pre($\alpha$) is a set of transitions that includes the transitions whose execution may enable $\alpha$. More formally, pre($\alpha$) includes all transitions $\beta$ such that there exists a state s for which $\alpha \notin enabled(s)$, $\beta \in enabled(s)$, and $\alpha \in enabled(\beta(s))$.

dep($\alpha$) is a set of transitions that are dependent on $\alpha$, i.e., $\{\beta | (\beta, \alpha) \in D\}$.

$T_i$ is the set of transitions of process $P_i$. $T_i(s) = T_i \cap enabled(s)$ denotes the set of transitions of $P_i$ that are enabled in the state s.

current$_i$(s) is the set of transitions of $P_i$ that are enabled in some state s' such that $pc_i(s') = pc_i(s)$. The set current$_i$(s) always contains $T_i(s)$. In addition, it may include transitions whose program counter has the value $pc_i(s)$, but are not enabled in s.

Note that on any path starting from s, some transition in current$_i$(s) must be executed before other transitions of $T_i$ can execute. The definitions of pre($\alpha$) and the dependency relation D (which directly effects dep($\alpha$)) may not be exact. The set pre($\alpha$) may contain transitions that do not enable $\alpha$. Likewise, the dependency relation D may also include pairs of transitions that are actually independent. This freedom makes it possible to calculate ample sets efficiently while preserving the correctness of the reduction. The above definitions are extended to sets in the natural way. For instance, $dep(T) = \cup_{\alpha \in T} dep(\alpha)$.

Next, we specialize pre($\alpha$) for various models of computation. Recalling that pre($\alpha$) includes all transitions whose execution from some state can enable $\alpha$, we construct pre($\alpha$) as follows:

The set pre($\alpha$) includes the transitions of the processes that contain $\alpha$ and that can change the program counter to a value from which $\alpha$ can execute.

If the enabling condition for $\alpha$ involves shared variables then pre($\alpha$) includes all other transitions that can change these shared variables.

If $\alpha$ involves message passing with queues, i.e., $\alpha$ sends or receives data on some queue q, then pre($\alpha$) includes the transitions of other processes that receive or send data, respectively, through q.

We now describe the dependency relation for the different models of computation.

1. Pairs of transitions that share a variable, which is changed by at least one of them, are dependent.
2. Pairs of transitions belonging to the same process are dependent. This includes in particular pairs of transitions in current$_i$(s) for any given state s and process $P_i$. Note that a transition that involves handshaking or rendezvous communication can be treated as a joint transition of both processes. Therefore, it depends on all of the transitions of both processes.
3. Two send transitions that use the same message queue are dependent. This is because executing one may cause the message queue to fill, disabling the other. Similarly, two receive transitions are dependent.

Note that a pair of send and receive transitions in different processes, which use the same message queue, are independent. This is because any one of these transitions can potentially enable the other but can not disable it.

An obvious candidate for ample(s) is the set $T_i$(s) of transitions enabled in s for some process $P_i$. Since the transitions in $T_i$(s) are interdependent, an ample set for s must include either all of the transitions or none of them. To construct an ample set for the current state s, we start with some process $P_i$ such that $T_i$(s) is not an empty set. Next, we check to determine whether ample(s)=$T_i$(s) satisfies condition C1. There are two cases in which this selection might violate C1. In both of these cases, some transitions independent of those in $T_i$(s) are executed, eventually enabling a transition a that is dependent on $T_i$(s). The independent transitions in the sequence cannot be in $T_i$, since all the transitions of $P_i$ are interdependent.

1. In the first case, a belongs to some other process $P_j$. A necessary condition for this to happen is that dep($T_i$(s)) includes a transition of process $P_j$. By examining the dependency relation, this condition can be checked effectively.
2. In the second case, α belongs to $P_i$. Suppose that the transition α∈$T_i$ that violates C1 is executed from a state s'. The transitions executed on the path from s to s' are independent of $T_i$(s) and hence, are from other processes. Therefore, pc$_i$(s')=pc$_i$(s). Therefore, α must be in current$_i$(s). In addition, α∉$T_i$(s), otherwise it does not violate C1. Thus, α∈current$_i$(s)\$T_i$(s). Since α is not in $T_i$(s), it is disabled in s. Hence, a transition in pre(α) must be included in the sequence from s to s'. A necessary condition for this case is that pre(current$_i$(s)\$T_i$(s)) includes transitions of processes other than $P_i$. This condition can also be checked effectively. In both cases we discard $T_i$(s) as an ample set, and can try the transitions $T_j$(s) of another process j as a candidate for ample(s). Note that we take a conservative approach and discard some ample sets even though at run-time it might be that condition C1 would actually not be violated.

The following code checks condition C1 for the enabled transitions of a process $P_i$, as explained above.
function check_C1(s,$P_i$)
   for all $P_j \neq P_i$ do
     if dep($T_i$(s))∩$T_j \neq \emptyset$ or pre(current$_i$(s)\$T_i$(s))∩$T_j \neq \emptyset$ then
     end if
   end for all
   return True
end function Conditions C0 and C1 are not sufficient. In order to be able to use the reduced model in place of the original model when verifying a system's design, one needs to ensure that the system is not sensitive to the paths and states that have been eliminated from the reduced model. To that end, another property of transitions is introduced, and a condition C2 is added on the requirements of the selected ample(s).

A transition is invisible if its execution has no effect on the state labeling. In other words, α∈T is invisible if ∀s, s', α(s, s')⇒L(s)=L(s'). A state s is called fully expanded if ample (s)=enabled(s). In this case, all transitions are selected for exploration and no reduction is performed at this point. From this follows the condition C2: The selected ample(s) is such that if there exists a visible transition in ample(s) then s is fully expanded.

Finally, we have to ensure that an enabled transition that does not belong to an ample set will eventually be taken. Otherwise, the constructions outlined in the discussion of C1 may close a cycle in the reduced state graph while never taking a non-ample transition, which is enabled throughout the cycle. Consequently some transitions of the larger model may be improperly ignored and the truth-value of a specification in the two models may no longer be the same. Condition C3 eliminates this potential problem.

C3: The selected ample(s) is such that at least one state along each cycle of the reduced state graph is fully expanded.

The cycle closing condition C3 is very natural to check while performing a depth-first search and a full treatment of ensuring condition C3 in a depth-first search schema is found in the aforementioned, incorporated, Peled article. It is not treated more extensively herein because, as stated above, one goal of this invention is to create a reduction algorithm that is not restricted to a depth-first state search, and condition C3 cannot be checked directly when performing a breadth-first search (which is intrinsic to symbolic methods).

We discovered that it is possible to ensure C3 by performing static checks on the local state-transition graphs of each of the individual processes that, together, make up the system. Conceptually, this improved approach to insuring that at least one state in each cycle of the reduced state graph is fully expanded is able to perform a reduction (in terms of the number of reached states) that is at least as good as the reduction obtained from traditional dynamic algorithms. In practice, however, there is a trade-off between the computational cost of the static reduction and computational savings afforded by the reduced model during the dynamic state space search. In fact, the most efficient balance in our algorithm may be achieved with varying degrees of state space reduction.

It is noted that both C2 and C3 limit the extent to which reduction can be performed because they define cases where a state has to be fully expanded. Moreover, if a cycle contains a visible transition, then C2 guarantees that the state at which that transition is taken is fully expanded, and therefore C3 holds for that cycle as well. This suggests that C2 and C3 can be combined into a single condition C2' that must be enforced:

C2' The selected ample(s) is such that there exists a set of transitions T which includes all visible transitions such that any cycle in the reduced state space contains a transition from T.

This means that when ample(s) includes a transition from T, s is fully expanded. We call the set of transitions T sticky transitions, since intuitively, they stick to all other enabled transitions. To perform a reduction during compilation of the modeled system while enforcing, or guaranteeing, C2', a set T of sticky transitions needs to be identified that breaks all cycles of the reduced state graph.

When a system to be verified is given as a set of component processes, an easy way to find such a set T is to look at the static control flow graph of each process of the system. Any cycle in the global state space projects to a cycle (or possibly a self-loop) in each component process. By breaking each local cycle, we are guaranteed to break each global cycle.

This suggests strengthening C2' to the following condition C2":

C2" The selected ample(s) is such that there is a set of sticky transitions that include all visible transitions.

This means that each cycle in the static control flow of a process of the modeled system contains at least one sticky transition, and if ample(s) includes a sticky transition, then s is fully expanded.

An ideal algorithm would find a minimal set of sticky transitions, in order to maximize the possible reduction. However, this problem is at least as hard as reachability analysis. On the other hand, efficient reduction can still be achieved even without a minimal set. During the state search, priority is given to non-sticky transitions. In this way, full expansion of a state is avoided as much as possible, although eventually no cycle can be closed without performing one full expansion. It is possible therefore that several sticky transitions are delayed until all of them can be taken from the same state, which reduces the effect of selecting too many sticky transitions.

Even with delaying sticky transitions, it is still important that the static analysis generates a smaller number of sticky transitions, and yet is simple enough not to require excessive computational overhead.

Condition C2" can be satisfied by using a static analysis algorithm on the (small) component processes, to find a set of sticky transitions T, lifted to the global state space from each respective component process. While finding a minimal sticky set is NP hard, (it is the same as removing transitions—the sticky ones—until there are no cycles left in the static control flow graph), it is NP hard in the size of the local control flow graph (i.e., each process) which is small, not the much bigger global state graph. Moreover, one need not find a minimal T. One way to find a set of sticky transitions in a local control graph is to choose all the back-edges in the course of a depth-first search, i.e., an edge from the currently searched state to a state currently in the search stack. The resulting T is the lifting of each local back-edge. Since the local control graphs are small, they can be searched at compile time, at no perceptible cost. (Any syntactic transition is assumed to be an edge in the local control graph. While this heuristic could be foiled by a process with many unsatisfiable transitions, this is not commonly the case, and a process is envisioned as not only small, but as having a sparse set of transitions).

The following presents a more mathematically oriented algorithm for finding sticky transitions.

Given a set of processes $\{P_1, P_2, \ldots P_N\}$ and for each process $P_i$ there is a program counter $cp_i$, which is a variable in a set of variables, V, a transition of $P_i$ updates $cp_i$, and also updates some other variable from V. The state space of a system is simply given by all possible valuations of the variables in V. The state-transition graph of the system is derived from the local state-transition graphs of the processes using interleaving semantics to model concurrently. A local cycle is a cycle in the state transition graph of a process, and a global cycle is a cycle in the state transition graph of the system. An execution of a cycle is the execution of all the transitions in the cycle starting from a state in the cycle.

An execution of a local cycle of a process $P_i$ restores the value of $cp_i$. But along the cycle, the values of other variables can change without necessarily being restored at the completion of the cycle. This is a side effect of a local cycle on a variable, and observe four different types of side effects:

(1) decrementing effect. if the execution of the cycle always reduces the value of the variable, (2) incrementing effect if the execution of the cycle always increases the value of the variable, (3) complex effect if the effect of the execution of the cycle on the variable cannot be determined statically, and (4) no effect if the variable is not changed by any of the transitions in the cycle.

If the side effect of a local cycle c is incrementing or decrementing over the value of a variable v, it is impossible to have a global cycle in which only c is executed. There must be some other local cycle c' executed in the global cycle to compensate for the side effect of c on v. For every global cycle in which c is executed, c' must be executed as well. Therefore, there is no need to select a sticky transition from both c and c' since neither c nor c' can appear alone in a global cycle.

Let C denote the set of local cycles in the system. We assume the existence of a function f: $C \times V \to \{-,+,*,0\}$ such that for $c \in C$ and $v \in V$, $f(c,v)=-$ means a decrementing effect on v by c ($f(c,v)=+$ mean incrementing, $f(c,v)=*$ means complex, and $f(c,v)=0$ means no effect). One can always assume, $f(c,v)=*$ if is updated within c but the side effect is difficult to analyze. Definition: A set of local cycles $H \subseteq C$ covers another set of local cycles $G \subseteq C$ if any global cycle that contains (projects to) a local cycle $c \in C$ also contains some local cycle $c' \in H$.

In the particular case where C is a singleton set $\{c\}$, we will simply say that H covers c.

We can effectively find a set of cycles that covers a local cycle c by considering the effect of c on some variable v. For a given local cycle c and a variable v, let $c_v$ be the set of local cycles that can compensate the incrementing or decrementing effect of c on v.

Since $c_v$ contains all cycles that can have the opposite effect on v compared to c, it follows that $c_v$ covers c. This implies that if for some variable v, all cycles in $c_v$ have a sticky transition, there is no need for c to have a sticky transition.

Our goal is to find a subset T of sticky transitions that breaks (when removed from the local process graphs) some set H of local cycles, such that H covers the entire set of local cycles C. Then, since every global cycle contains some local cycle $c \in C$, it also has to contain a cycle from H, and with it a sticky transition. Consequently, condition C' holds.

To find such a set, note that trivially H covers H for any $H \subseteq C$. We also employ the following lemma: If $H, G \subseteq C$ and $c \in C$, then if H covers C and C covers c then H covers $G \cup \{c\}$.

Thus, the following algorithm computes a set H such that H covers C. It alternates between analyzing the effect of local cycles on variables to increase the covered set C and adding cycles to H if there are still uncovered cycles in C. Choose $H \subseteq C$, let G:=H loop
  do
    let updated:=false
    $\forall c \in C \backslash G, \cup v \in V$
      if $f(c.v) \in \{-,+\}$ and $c_v \subseteq G$ then
        let G:=$G \cup \{c\}$
        let updated:=true while
if (G=C) return H
let $H:=H\cup C_{add}$, $G:=G\cup C_{add}$ for some $C_{add}\subseteq C\backslash G$, $C_{add}\neq\emptyset$
endloop The selection of an initial set of marked cycles can be arbitrary. A good starting values is given by the sticky transitions which are already required by C2'; e.g. the set of all cycles that include a visible transition.

It should be noted that priority is given to transitions that are not sticky. Sticky transitions may be deferred, although no cycle can be closed without having passed through at least one sticky transition. It is possible that a global cycle may include more than one fully expanded state, due to sticky transitions lifted from different processes. However, since sticky transitions have low priority, and the reduction algorithm tries to select the other transitions first, it may be worthwhile to defer several of them to a point where they all can be taken from the same state. This is possible because the expansion for sticky transitions may occur anywhere along a cycle.

In practice, one may weaken condition C2" as follows. A cycle in the reduced state graph cannot consist of only receiving messages, since all message queues would then become eventually empty, and some sending messages (a "send" event) would be required to close the cycle. Thus, local control flow cycles with only message receives do not have to include a sticky transition; it must be part of another cycle projected from a cycle in the global state graph. (While that this is true also for sending messages—the queues will eventually get filled—if the same relaxation is allowed at the same time to both sending and receiving messages, they can cancel the effect of one another and be part of a global state graph cycle.) This observation can be used to design an algorithm that is linear in the size of the control graphs of each process. After removing the receiving transition from the control graph of a process, a linear time search can be performed on the remaining transitions to identify any back-edges and mark them as the sticky transitions.

There are many ways to further relax condition C2". One is to involve the user to some extent in further marking sticky transitions. This would reduce the more arbitrary assignment, which would result from choosing all back-edges, as disclosed above. Another way is to perform the back-edge analysis after combining a few processes—only the cycles of the larger structure need be broken.

Application of the above-disclosed rules, together with a given state graph generator (the implicit system specification) of the system to be verified is illustrated in FIG. 1. A specification of processes is presented to block 100 in a selected language, such as SDL. Based on some given initial conditions, block 100 selects an initial state for the system, stores it in a table and marks it as "considered". Control then passes to block 110 which calculates (by application of the given generator) all enabled successor states from the picked state, and selects for an ample set a subset of the enabled transitions that meets the above-disclosed C0 and C1 conditions, and one of the modified conditions based on C2 and C3 (e.g., C2' or C2"). The ample set is typically identified by selecting the enabled transitions of one of the concurrent processes, and testing for the Conditions. If the Conditions are not met, the transitions of another process are selected and tested. The transitions of more than one of the processes can be picked. If a subset of the enabled transitions that meets the Conditions is not found. the flow control of blocks 120 and 130 causes the entire set of enabled transitions to be picked. Block 140 then calculates the state to which each of the transitions in the ample set moves the system, and block 150 stores those states in the table, if they are not already there. Control then passes to block 150, which determines whether there are states in the table that have not yet been considered. When such is the case, control passes to block 170 which picks a transition from the table that has not been considered, marks it as "considered", and passes control to block 110. This picking is not restricted to a depth-first search approach. Rather, any search approach can be undertaken, including a breadth-first search approach. The process terminates when block 160 finds that all of the states found in the table are marked as "considered".

It should be understood that the above-disclosed algorithm generally, and in particular the conditions that a picked ample set is to satisfy are illustrative of the principles of this inventions. The disclosed modifications to Conditions C2 and C3 are illustrative, other modifications can be implemented, and, indeed, the other Conditions can be modifies or augmented, without departing from the spirit and scope of this invention.

We claim:

1. A computer-based tool comprising:
 a set of modules that implement rules which, in response to an input program that defines a system, permit creation of an intermediate program with a reduced state space, including a module that implements a rule that converts said intermediate program to a final program that is equivalent to said input program and has said reduced state space.

2. The tool of claim 1 where said system is a multi-process system, and said rule that imposes a condition that includes in said final program at least one transition along each cycle in each process of said multi-process input program that defines a system, and where said condition breaks all cycles statically.

3. The tool of claim 2 where said condition expands all deferred transitions of the system.

4. The tool of claim 1 where said system is a multi-process system and said rule imposes a condition that each cycle of each process of said multi-process system include at least one sticky transition.

5. A tool implemented in a computer system including a processor and a memory, responsive to an applied input system specification that defines a system that describes a hardware-centric or a software-centric multi-process system to be verified from a model of said system that is stored in said memory, which tool includes a first module that generates a set of directives in response to said input system specification, where the set of directives in combination with said input system specification forms a reduced state space for said system, the improvement comprising:
 a second module that, together with said first module, transforms said input system specification to an output system specification that has said reduced state space for said system, and which is adapted for application to model-checking apparatus.

6. A method carried out in a computer that includes a processor and a memory, for statically creating a specification of a reduced system from an input specification of said system maintained in said memory, where said reduced system is equivalent to said input specification, but with a reduced state space with respect to the state space of said input specification, comprising the steps of:
 selecting an initial state of said input system as a selected state;
 assigning said selected state to said reduced system and marking the selected state in said memory as having been considered;

identifying enabled transitions of said input system at the selected state;

selecting a subset of enabled transitions, in accordance with a rule that imposes a condition on each of the said operating modules individually that, among the states assumed by an operating module in each cycle of states of the operating module, there is at least one state whose transitions are fully expanded;

calculating a successor state of each of said enabled transitions in the selected subset;

assigning to said reduced system those of the states calculated in said step of calculating that are not already assigned to said reduced system;

designating one of the states in said memory that is not marked as having been considered as the selected state; and returning to said step of identifying.

7. The method of claim 6 where said step of selecting a state is carried out in accordance with any state-search algorithm.

8. The method of claim 6 where said step of selecting a state is carried out in accordance with a breadth-first state-search algorithm.

9. The method of claim 6 where said step of selecting a subset selects a subset that also meets the condition that on any path starting from said state and traversing successor states, all the transitions appearing before a transition that is also found in the selected subset are independent of all of the transitions in the selected subset.

10. A method carried out in a computer that includes a processor a memory, for transforming an input specification of a physical system of operating modules, stored in a first segment of said memory, to a reduced state-space specification of said physical system, stored in a second segment of said memory, comprising the steps of:

selecting an initial state of said system from said first segment of said memory as a selected state;

storing the selected state in said second segment of said memory, and marking the selected state as having been considered;

identifying a set of enabled transitions of said system at the selected state, where said set of enabled transitions comprises subsets of enabled transitions of said operating modules;

selecting at least one of said subsets of enabled transitions that do not include sticky transitions, and all of said subsets of enabled transitions when none of said subsets are devoid of sticky transitions;

calculating a successor state of each of said enabled transitions in the selected subset;

storing in said second segment of said memory those of the states calculated in said step of calculating that are not found in said second segment of said memory;

designating one of the states in said first segment of said memory that is not marked as having been considered as the selected state; and returning to said step of identifying.

11. The method of claim 10 further comprising the step of applying said reduced state-space specification of said physical system to a model-checking algorithm.

12. The method of claim 11 where said model-checking algorithms is a synchronous model checking algorithm.

13. The method of claim 11 further comprising a step of converting said reduced state-space specification of said physical system to a language compatible with said model-checking algorithm.

14. A verification tool implemented in a computer that includes a memory, for reducing a specification of an input system of concurrent processes that includes a first plurality of states, to a transformed specification of said system that includes a second plurality of states, where the transformed specification of said system is stored in a file within said memory and where the second plurality is smaller than the first plurality, comprising:

first means for selecting a state of said input system that has not yet been considered from said first plurality of states;

second means for storing the selected state in said file and marking said state as having been considered;

third means for identifying enabled transitions of said system at said state;

fourth means for individually analyzing each of said concurrent processes, and selecting a subset of enabled transitions such that at least one state along each cycle in the subset of enabled transitions is fully expanded;

fifth means for calculating a successor state of each of said enabled transitions in the subset;

sixth means for storing in said file those of the states calculated in said fifth means that are not found in said file; and a controller for returning control to said second means as long as there are states in said input system specification that are not marked as having been considered.

15. A computer-based tool that includes a module that generates a set of directives in response to an input computer program that defines a given system that includes hardware, software, or both hardware and software, which set of directives, in combination with said input program, forms a reduced state space, the improvement comprising:

a module that creates a reduced computer program with a state space that is equivalent to said reduced state space.

* * * * *